(12) United States Patent
Gao et al.

(10) Patent No.: US 11,917,850 B2
(45) Date of Patent: Feb. 27, 2024

(54) DISPLAY PANEL, PREPARATION METHOD THEREOF AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Wei Gao, Shanghai (CN); Lei Zhang, Shanghai (CN); Wenjing Xiao, Shanghai (CN); Wenpeng Dai, Shanghai (CN); Jinghua Niu, Shanghai (CN); Ping An, Shanghai (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 247 days.

(21) Appl. No.: 16/902,924

(22) Filed: Jun. 16, 2020

(65) Prior Publication Data

US 2021/0202898 A1 Jul. 1, 2021

(30) Foreign Application Priority Data

Dec. 31, 2019 (CN) ........................... 201911411185.4

(51) Int. Cl.
*H01L 33/02* (2010.01)
*H10K 50/844* (2023.01)
(Continued)

(52) U.S. Cl.
CPC ........... *H10K 50/844* (2023.02); *H10K 71/00* (2023.02); *G06F 1/1626* (2013.01)

(58) Field of Classification Search
CPC ... H01L 51/002; H01L 51/5267; H01K 71/30; H01K 50/354; H01K 50/854
See application file for complete search history.

(56) References Cited

U.S. PATENT DOCUMENTS 6,433,944 B1 * 8/2002 Nagao ................... G11B 5/865
360/17
2004/0213954 A1 * 10/2004 Bourdelais ............ H05K 3/107
428/119
(Continued)

FOREIGN PATENT DOCUMENTS

CN      106953020 A      7/2017
CN      109166905 A      1/2019
(Continued)

OTHER PUBLICATIONS

CN 201911411185.4 First Office Action dated Dec. 30, 2021, English Translation.

*Primary Examiner* — Ali Naraghi
(74) *Attorney, Agent, or Firm* — Alston & Bird LLP

(57) ABSTRACT

The display panel includes a plurality of light-emitting areas and a plurality of non-light-emitting areas, the plurality of light-emitting areas being space apart from each other by the plurality of non-light-emitting area; light-emitting elements each located in one of the plurality of light-emitting areas and including an anode and a cathode that are opposite to each other, and a light-emitting layer located therebetween; a cover layer covering a light-emission side of the light-emitting element. The cover layer includes a substrate and first dopants doped in the substrate, the first dopants are magnetic. When an external magnetic field intensity applied to the cover layer is changed by an amount greater than a preset magnetic field intensity, the first dopants in the substrate are rearranged from a first mode to a second mode.

19 Claims, 6 Drawing Sheets

(51) Int. Cl.
*H10K 71/00* (2023.01)
*G06F 1/16* (2006.01)

(56) References Cited

U.S. PATENT DOCUMENTS

| | | | | |
|---|---|---|---|---|
| 2010/0244085 | A1* | 9/2010 | Xuan | H01L 33/38 |
| | | | | 257/E33.062 |
| 2012/0098024 | A1* | 4/2012 | Hsu | H01L 33/38 |
| | | | | 257/E33.066 |
| 2012/0326189 | A1* | 12/2012 | Lee | H10K 50/818 |
| | | | | 257/E33.072 |
| 2016/0172536 | A1* | 6/2016 | Tsai | H01L 33/40 |
| | | | | 257/13 |
| 2019/0011620 | A1* | 1/2019 | Kuroda | H01L 51/50 |
| 2019/0043935 | A1* | 2/2019 | Du | H10K 59/00 |
| 2019/0115552 | A1* | 4/2019 | Qin | H10K 50/15 |
| 2020/0203436 | A1* | 6/2020 | Li | H01L 51/003 |
| 2021/0039096 | A1* | 2/2021 | Spero | B01F 33/4533 |

FOREIGN PATENT DOCUMENTS

| | | | |
|---|---|---|---|
| CN | 109461827 | A | 3/2019 |
| CN | 110265566 | A | 9/2019 |
| CN | 110294965 | A | 10/2019 |

* cited by examiner

DISPLAY PANEL, PREPARATION METHOD THEREOF AND DISPLAY DEVICE

CROSS-REFERENCE TO RELATED DISCLOSURES

The present application claims priority to Chinese Patent Application No. CN201911411185.4, filed on Dec. 31, 2019, the content of which is incorporated herein by reference in its entirety.

TECHNICAL FIELD

The present disclosure relates to the field of display technologies, and in particular, to a display panel, a preparation method thereof, and a display device.

BACKGROUND

With continuous development of display technology, requirements from consumers for display panels are increasing, and various display panels have emerged in large numbers and have developed rapidly, examples are liquid crystal display panels, organic light-emitting displays, and other display panels. Thus, display technologies such as 3D display, touch display technology, curved surface display, ultra-high-resolution display, and anti-peep display continue to emerge to meet consumers' demands.

The organic light-emitting display panels made of organic light-emitting diodes (OLED) have advantages of light weight, thinness, easy bending, high contrast, and low power consumption and so on, so that it is widely favored by consumers, and it is now a hot area in the field of display research. In the organic light-emitting display panel, the organic light-emitting element (diode) is a key component that generates and emits light. The organic light-emitting element includes an anode and a cathode that are arranged opposite to each other, and a light-emitting layer. Electrons enter the light-emitting layer from the cathode side, holes enter the light-emitting layer from the anode side, and the electrons and the holes recombine in the light-emitting layer to form excitons that excite a light-emitting material to emit light. However, in a current organic light-emitting structure, there are problems of color shift at a large viewing angle and a low luminous efficiency.

SUMMARY

Embodiments of the present disclosure provide a display panel, a display device, and a preparation method thereof, which can enhance scattering of light to improve the color shift problem at large viewing angles, and improve the luminous efficiency by utilizing characteristics of orientation of magnetic particles under a magnetic field.

An embodiment of the present disclosure provides a display panel, the display panel having a plurality of light-emitting areas and a plurality of non-light-emitting areas, the plurality of light-emitting areas being spaced apart from each other by the plurality of non-light-emitting areas, and the display panel including: a plurality of light-emitting elements each located in one of the plurality of light-emitting areas, each of the plurality of light-emitting elements including an anode and a cathode that are arranged opposite to each other and a light-emitting layer located between the anode and the cathode; and a cover layer covering a light-emission side of each of the plurality of light-emitting elements. The cover layer includes a substrate and first dopants doped in the substrate, the first dopants is magnetic, and when an amount of intensity change of an external magnetic field applied to the cover layer is greater than preset magnetic field intensity, an arrangement of the first dopants in the substrate is changed from a first mode to a second mode.

Another embodiment of the present disclosure further provides a preparation method of a display panel, including: preparing a substrate plate, the substrate plate having a plurality of light-emitting areas and a plurality of non-light-emitting areas, the plurality of light-emitting areas being spaced apart from each other by the plurality of non-light-emitting areas; preparing a light-emitting element in each of the plurality of light-emitting areas, the light-emitting element including an anode and a cathode that are arranged opposite to each other, and a light-emitting layer located between the anode and the cathode; preparing a cover layer on a light-emission side of the light-emitting element, wherein the cover layer includes a substrate and first dopants doped in the substrate, the first dopants is magnetic, and when an amount of intensity change of an external magnetic field applied to the cover layer is greater than preset magnetic field intensity, an arrangement of the first dopants in the substrate is changed from a first mode to a second mode.

Another embodiment of the present disclosure further provides a display device including the display panel described above.

The display panel, the preparation method thereof, and the display device in the embodiments of the present disclosure, by providing the magnetic first dopants in the cover layer on the light-emission side of the light-emitting element, in one aspect, can improve the scattering effect of the emitted light in the cover layer, thereby improving a microcavity effect at large viewing angles, that is, improving the visual color shift at large viewing angles; in another aspect, characteristics of magnetic particles being orientated under an action of the magnetic field can be used to achieve an orientated arrangement of the first dopants, to form a more orderly particle arrangement in the cover layer, thereby improving a light extraction effect of the cover layer, that is, improving the luminous efficiency of the light-emitting element.

BRIEF DESCRIPTION OF DRAWINGS

In order to better illustrate the embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

Figure 1:
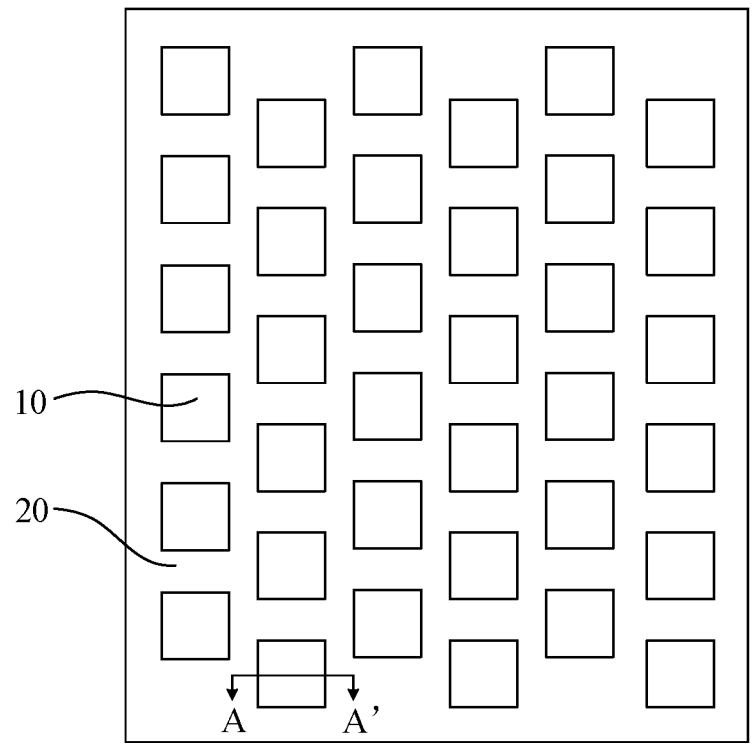
FIG. 1 illustrates a plan view of a partial structure of a display panel according to an embodiment of the present disclosure.
Figure 2:
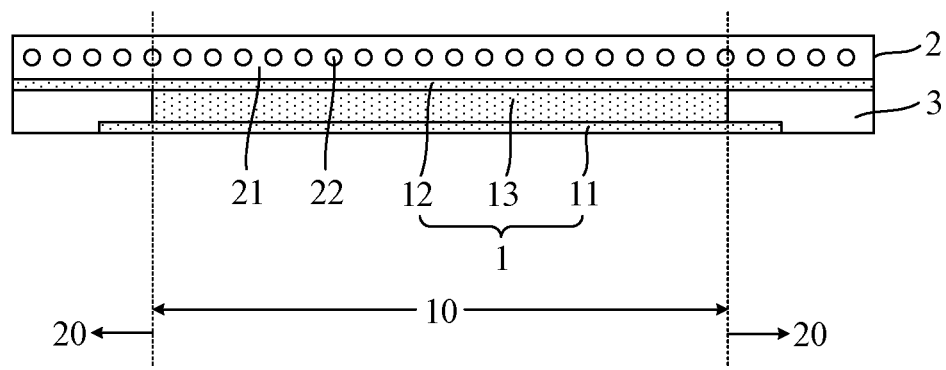
FIG. 2 illustrates a schematic cross-sectional view of the structural diagram of the display panel in FIG. 1 taken along an AA' direction.

As shown in FIG. 1 and FIG. 2, FIG. 1 illustrates a plan view of a partial structure of a display panel according to an embodiment of the present disclosure, and FIG. 2 illustrates a schematic cross-sectional view of the structural diagram of the display panel in FIG. 1 taken along an AA' line. The display panel includes: light-emitting areas 10 and a non-light-emitting area 20 located outside of the light-emitting areas 10; a light-emitting element 1, located in one of the light-emitting area 10 and including an anode 11 and a cathode 12 that are arranged opposite to each other, and a light-emitting layer 13 located between the anode 11 and the cathode 12; a cover layer 2, covering a light-emission side of the light-emitting element 1. The cover layer 2 includes a substrate 21, a first dopant 22 is doped in the substrate, and the first dopant 22 is magnetic. When the external magnetic field intensity applied to the cover layer 2 changes by an amount that is larger than a preset magnetic field intensity, the first dopant 22 in the substrate 21 is arranged to change from a first mode to a second mode.

For example, the display panel further includes a pixel definition layer 3. The pixel definition layer 3 is provided with a plurality of openings, and a corresponding light-emitting layer 13 is provided in the opening. The opening defines a shape and a size of the light-emitting layer 13, that is, the opening defines the light-emitting area 10, so that the light-emitting layer 13 emits light in the light-emitting area 10. During a display process, a voltage is applied to the anode 11 and the cathode 12 of the light-emitting element 1. Under the voltage, holes and electrons are respectively injected into the light-emitting layer 13 and recombined in the light-emitting layer 13 to achieve light emission. In the structure shown in FIG. 2, an upper side is the light-emission side of the light-emitting element 1, the cathode 12 may be a transparent material or a semi-transparent material, and the anode 11 may be a reflective material, so that the light generated by the light-emitting element 1 is finally emitted from the light-emission side, and the light will pass through the cover layer 2 during emission. Since the first dopant 22 is provided in the cover layer 2, a scattering effect of the emitted light in the cover layer 2 is improved, which further improves a microcavity effect at large viewing angles, that is, color shift at large viewing angles is improved. In addition, since the first dopant 22 is magnetic and the arrangement manner can be changed under the impact of the external magnetic field, during preparation of the cover layer 2, the arrangement manner of the first dopant 22 in the substrate 21 is changed by the action of the external magnetic field, to enable the first dopant 22 to achieve the orientated arrangement. That is, the particles of the first dopant 22 in the cover layer 2 are arranged more orderly, so as to further improve the light extraction effect of the cover layer 2, that is, to improve the luminous efficiency of the light-emitting element.

In the display panel according to the present disclosure, by providing the magnetic first dopants in the cover layer on the light-emission side of the light-emitting element, in one aspect, the scattering effect of the emitted light in the cover layer can be improved, thereby improving the microcavity effect at large viewing angles, that is, improving the visual color shift at a large viewing angles; in another aspect, characteristics of magnetic particles being orientated under the impact of the magnetic field can be used to achieve the orientated arrangement of the first dopants, to form a more orderly particle arrangement in the cover layer, thereby improving the light extraction effect of the cover layer, that is, improving the luminous efficiency of the light-emitting element.

In one embodiment, when the external magnetic field intensity applied to the cover layer 2 changes by an amount which is larger than the preset magnetic field intensity, the first dopant 22 move in the substrate 21 along a certain direction. The first dopants in the substrate 21 will rearrange distribution from the first mode to the second mode, and the process of the directional movement can cause the first dopants 22 to achieve a uniform orientation in the substrate 21.

In one embodiment, the light-emission side of the light-emitting element 1 faces the cathode 12, and the external magnetic field generates a first magnetic force, which force is from the cathode 12 towards the anode 11, on the first dopant 22.

For example, in the structure shown in FIG. 2, the light-emission side of the light-emitting element 1 faces upward, and the direction of the external magnetic field is downward. In this magnetic field, a downward force is generated on the first dopant 22 and causes the first dopant 22 to move downward. The process of driving the first dopant 22 to move downward by the external magnetic field is a process of orientating the first dopant 22 during the preparation of the cover layer 2, which, in one aspect, can cause the first dopant 22 to form, after movement, the orderly arrangement to achieve orientation, and in another aspect, can cause the cover layer 2 to generate a downward force, to improve the bonding effect between the respective film layers in the display panel and thus reduce a problem of peeling between the respective film layers due to bending or other reasons.

Figure 3:
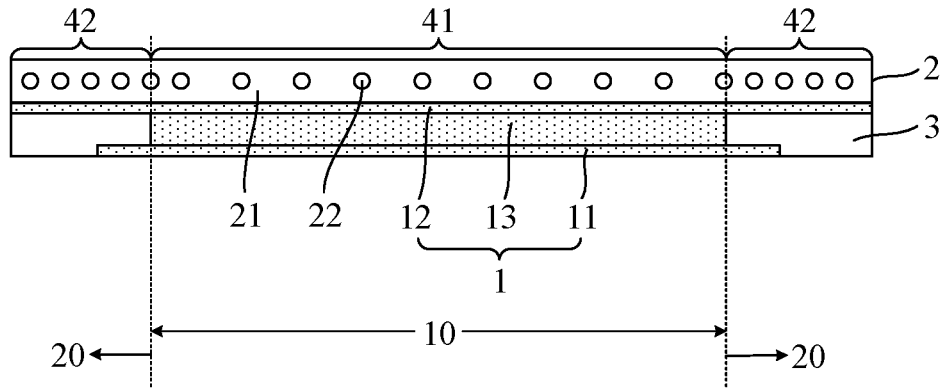
FIG. 3 illustrates another schematic cross-sectional view of the structural diagram of the display panel in FIG. 1 taken along an AA' direction.
Figure 4:
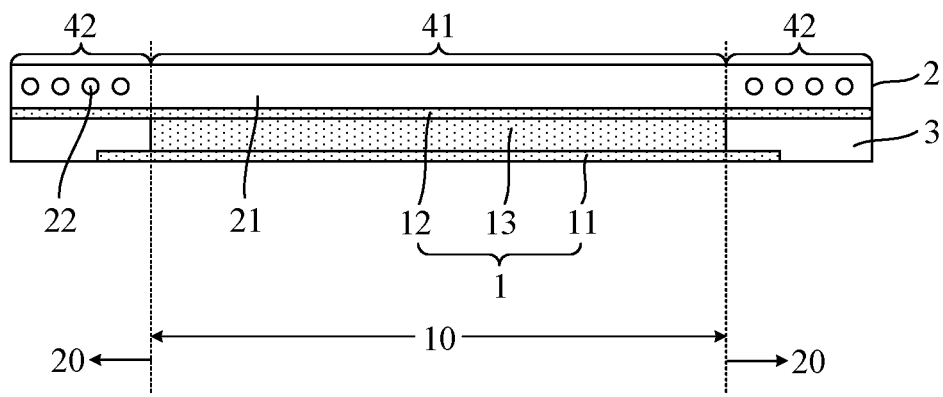
FIG. 4 illustrates another schematic cross-sectional view of the structural diagram of the display panel in FIG. 1 taken along an AA' direction.

In one embodiment, as shown in FIG. 3 and FIG. 4, FIG. 3 illustrates another schematic cross-sectional view of the structural diagram of the display panel in FIG. 1 taken along an AA' line, and FIG. 4 illustrates another schematic cross-sectional view of the structural diagram of the display panel in FIG. 1 taken along the AA' line. The cover layer 2 includes a first section 41 and a second section 42. In a direction perpendicular to a surface of the display panel, the first section 41 corresponds to the light-emitting area 10, and the second section 42 corresponds to the non-light-emitting area 20.

In one embodiment, as shown in FIG. 3 or FIG. 4, in the first section 41, a doping concentration of the first dopant 22 is a first concentration C1, and in the second section 42, a doping concentration of the first dopant 22 is a second concentration C2, where C2≥C1≥0.

For example, in the structure shown in FIG. 3, C2>C1>0. That is, in the second section 42, the concentration of the first dopant 22 is relatively low in order to reduce an adverse effect of the first dopant 22 on the light emitted at a positive viewing angles, and in the first section 41, the concentration of the first dopant 22 is relatively high, so as to improve a force applied to the respective film layers by movement of the first dopant 22 during the preparation of the cover layer 2, thereby further improving the bonding effect between the respective film layers in the display panel. In the structure shown in FIG. 4, C1=0, that is, there is no first dopant 22 in the first section 41, and the first dopant 22 is only provided in the second section 42, C2>0, which can also reduce the adverse effect of the first dopant 22 on light emitted at a positive viewing angle and further improve the bonding effect between the respective film layers in the display panel.

Figure 5:
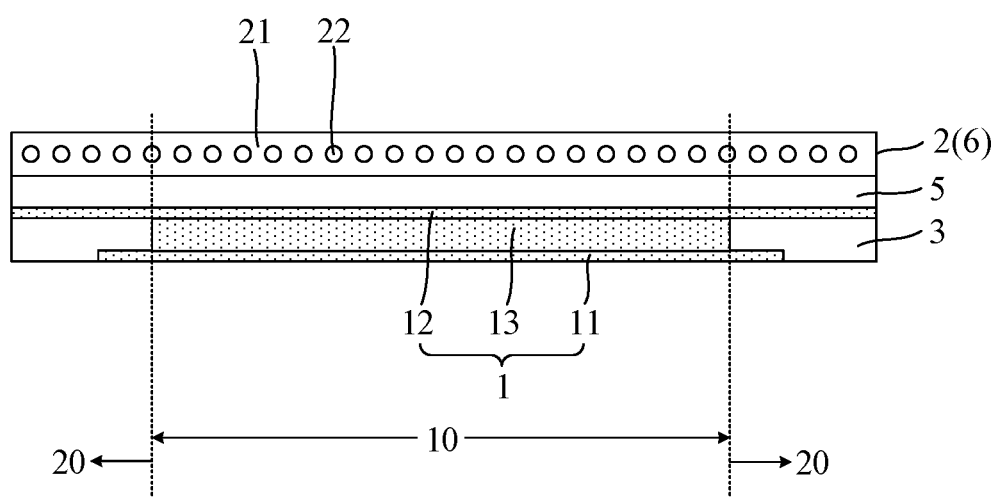
FIG. 5 illustrates another schematic cross-sectional view of the structural diagram of the display panel in FIG. 1 taken along an AA' direction.

In one embodiment, as shown in FIG. 5, FIG. 5 illustrates another schematic cross-sectional view of the structural diagram of the display panel in FIG. 1 taken along the AA' line. The display panel includes a capping layer 5 (CPL) covering the light-emission side of the light-emitting element 1, and an encapsulation layer 6 on a side of the capping layer 5 facing away from the light-emitting layer 13. The capping layer 5 has a relatively large refractive index and a relatively small light absorption coefficient, for improving the light extraction efficiency. The encapsulation layer 6 is configured to seal the light-emission side of the light-emitting element 1 to reduce erosion on the light-emitting element 1 by external water and oxygen.

In one embodiment, as shown in FIG. 5, the cover layer 2 is the encapsulation layer 6. That is, the first dopant 22 is provided in the encapsulation layer 6, so that the encapsulation layer 6 is also used as the cover layer 2, so as to achieve functions of the two at the same time, thereby reducing an overall film thickness of the display panel and reducing process cost.

Figure 6:
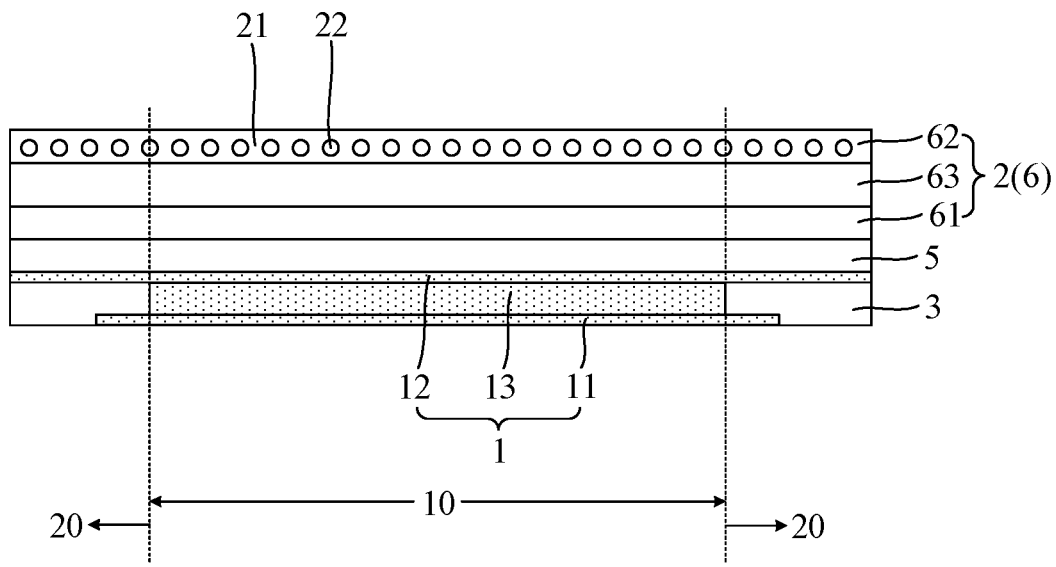
FIG. 6 illustrates another schematic cross-sectional view of the structural diagram of the display panel in FIG. 1 taken along an AA' direction.

In one embodiment, as shown in FIG. 6, FIG. 6 illustrates another cross-sectional structural schematic diagram of the display panel in FIG. 1 taken along the AA' direction. The encapsulation layer 6 is a thin film encapsulation layer, and the thin film encapsulation layer includes a first inorganic layer 61, a second inorganic layer 62, and an organic layer 63 located between the first inorganic layer 61 and the second inorganic layer 62. The first inorganic layer 61 is located on a side of the second inorganic layer 62 facing the light-emitting element 1.

The first inorganic layer 61 and the second inorganic layer 62 are configured to achieve the function of blocking water and oxygen through a relatively denser structure, and the organic layer 63 is configured to relieve stress between the first inorganic layer 61 and the second inorganic layer 62, to alleviate a problem of stress concentration in the encapsulation layer 6 and reduce a probability of cracking.

In one embodiment, as shown in FIG. 6, the first dopant 22 is doped in at least one of the first inorganic layer 61, the second inorganic layer 62, or the organic layer 63. It should be noted that FIG. 6 only illustrates a structure in which the first dopant 22 is doped in the second inorganic layer 62, but the embodiments of the present disclosure have no limitations on this.

In one embodiment, as shown in FIG. 6, the first dopant 22 is doped in the second inorganic layer 62, and the second inorganic layer 62 is located on a side of the first inorganic layer 61 and the organic layer 63 facing away from the light-emitting element 1. Therefore, during preparation of the second inorganic layer 62, in a process of moving the first dopant 22 towards the direction of the anode 11 under the action of the external magnetic field, a force is applied to the respective film layers including the first inorganic layer 61 and the organic layer 63, so that the bonding effect between the film layers can be improved.

Figure 7:
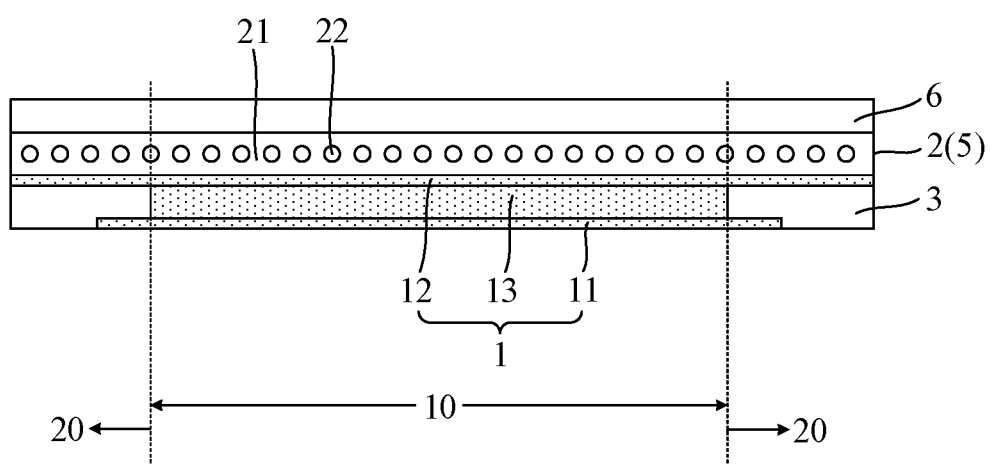
FIG. 7 illustrates another schematic cross-sectional view of the structural diagram of the display panel in FIG. 1 taken along an AA' direction.

In one embodiment, as shown in FIG. 7, FIG. 7 illustrates another cross-sectional structural schematic diagram of the display panel in FIG. 1 taken along the AA' direction. The cover layer 2 is the capping layer 5. That is, the first dopant 22 is provided in the capping layer 5 so that the capping layer 5 is also used as the cover layer 2, in order to achieve functions of the two at the same time, thereby reducing the overall film thickness of the display panel and reducing process cost.

Figure 8:
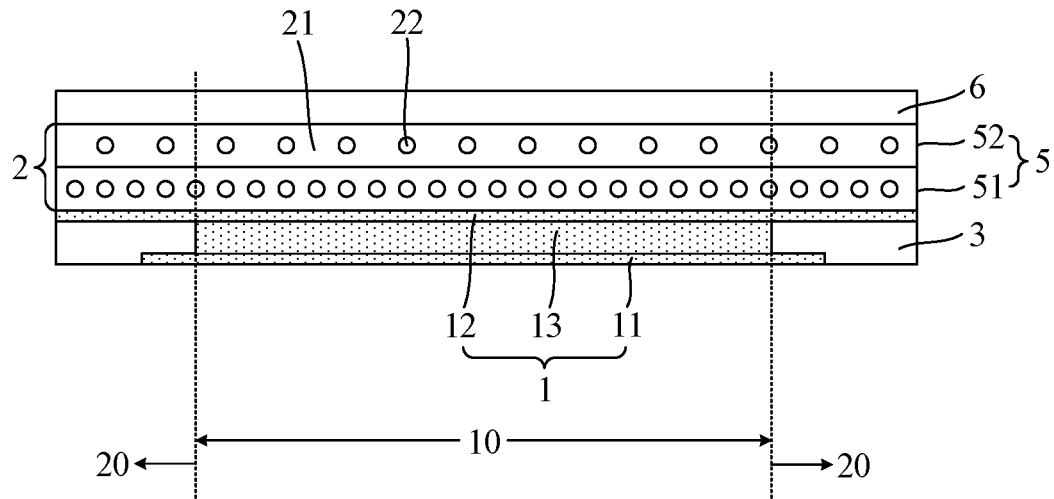
FIG. 8 illustrates another schematic cross-sectional view of the structural diagram of the display panel in FIG. 1 taken along an AA' direction.

In one embodiment, as shown in FIG. 8, FIG. 8 illustrates another cross-sectional structural schematic diagram of the display panel in FIG. 1 taken along the AA' direction. The capping layer 5 includes a first capping layer 5 and a second capping layer 52. The second capping layer 52 is located on a side of the first capping layer 51 facing away from the light-emitting element 1. A doping concentration of the first dopant 22 in the first capping layer 51 is a third concentration C3, and a doping concentration of the first dopant 22 in the second capping layer 52 is a fourth concentration C4, where C3≥C4≥0.

For example, in the structure shown in FIG. 8, each of the first capping layer 51 and the second capping layer 52 is provided with the first dopant 22, but the concentration of the first dopant 22 in the first capping layer 51 is higher than the concentration of the first dopant 22 in the second capping layer 52. In another possible implementation manner, it is possible that the first dopant 22 is provided only in the first capping layer 51 and the first dopant 22 is not provided in the second capping layer 52. In one aspect, in order to balance the scattering effect of the emitted light and the efficiency of the light-emission, the concentrations of the first capping layer 51 and the second capping layer 52 are configured to be different. In another aspect, in the process of preparing the film layer, provision of the first dopant 22 may cause the film formation to be uneven, that is, cause the film formation surface to be uneven. In order to maintain smoothness of an entire upper surface of the capping layer 5 to improve the roughness, the concentration of the first dopant 22 in the first capping layer 51 close to a lower side is configured to be relatively high, and the concentration of the first dopant 22 in the second capping layer 52 close to the upper side is configured to be relatively low, or the doping of the particles is not provided in the second capping layer 52 close to the upper side, to make the upper surface of the finally prepared capping layer 5 smoother and flatter.

In one embodiment, in the embodiment of the present disclosure, the first dopant 22 may be magnetic nanoparticles, and diameters of the magnetic nanoparticles can be 1-40 nm, such as 1-10 nm. When the diameter of the particle is smaller than a wavelength of the light, the light will bypass the particle and travel in all directions, which results in better scattering to further improve the color shift at large viewing angles and can also decrease the relatively large degree of roughness of the film layer caused by the relatively large particle diameters, so as to further alleviating a problem that the life of the light-emitting element is relatively low caused by the roughness of the film layer. In the cover layer 2, a mass ratio of the first dopants 22 to the substrate 21 may be 0.01-30%, for example, 0.01-10%.

In one embodiment, a material of the first dopant 22 is a ferromagnetic or antiferromagnetic material. Under an action of a magnetic field, the ferromagnetic material can generate a relatively strong attractive force, and it is much easier for directional movement to occur, thereby making it much easier to control its movement in a direction of the magnetic field.

In one embodiment, the material of the first dopant 22 is one or an alloy of iron nanoparticles, cobalt nanoparticles, nickel nanoparticles, and ferro ferric oxide nanoparticles. In one embodiment, the material of the first dopant 22 is cobalt oxide nanoparticles. In one embodiment, the material of the first dopants 22 is a paramagnetic material. As for the paramagnetic material, it cannot be spontaneously magnetized without an application of an external magnetic field. Therefore, under an action of an external magnetic field, an influence of an external environment on the first dopant 22 is relatively small so that it can be uniformly distributed in the cover layer 2 to play a role of scattering, while under the action of the magnetic field, it can be magnetized so as to move directionally. In this way, it is more beneficial to switch a mode of the first dopant 22 by turning on or off a magnetic field.

In one embodiment, the material of the first dopants 22 is ferro ferric oxide nanoparticles or silica-coated ferro ferric oxide nanoparticles. The ferro ferric oxide nanoparticles are super-paramagnetic and can easily move along certain direction under the impact of the magnetic field, thereby making it more beneficial to switch a mode of the first dopant 22 by turning on and off a magnetic field.

In addition, in one embodiment, the magnetic material in the present disclosure may also include other magnetic materials, such as magnetic manganese zinc ferrite nanoparticles, rare earth metal oxide nanoparticles, etc., which is not specifically limited in the present disclosure.

Figure 9:
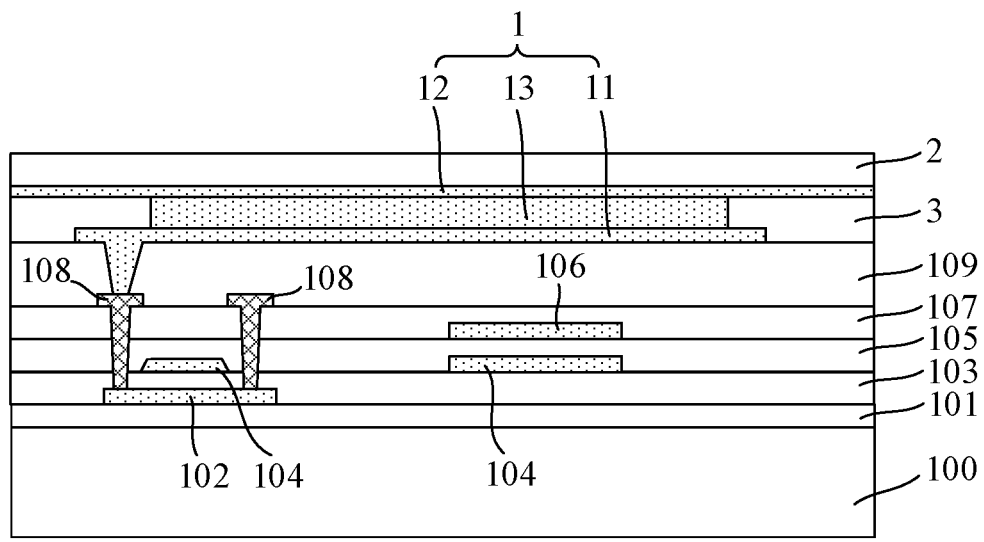
FIG. 9 illustrates another schematic cross-sectional view of the structural diagram of the display panel in FIG. 1 taken along an AA' direction.

In one embodiment, as shown in FIG. 9, FIG. 9 illustrates another schematic cross-sectional view of the structural diagram of the display panel in FIG. 1 taking along the line AA'. On the side of the anode 11 facing away from the cathode 12, in a direction towards the anode 11, that is, from bottom to top, the display panel further includes a substrate layer 100, a buffer layer 101, a semiconductor layer 102, a gate insulation layer 103, a gate metal layer 104, a first interlayer insulation layer 105, a capacitor metal layer 106, and a second interlayer insulation layer 107, a source-drain metal layer 108, and a planarization layer 109 that are arranged sequentially. The semiconductor layer 102 is configured to form an active layer of a transistor, the gate metal layer 104 is configured to form a gate of a transistor and an electrode plate of a capacitor, and the capacitor metal layer 106 is configured to form another electrode plate of the capacitor. The source-drain metal layer 108 is configured to form a source electrode and a drain electrode of a transistor, and a signal line. The transistor and the capacitor above are configured to form a pixel driving circuit to control the light-emitting element 1. In addition, the light-emitting element 1 may further include other functional film layers. For example, in the direction from the anode 11 to the cathode 12, the light-emitting element 1 sequentially includes the anode 11, a hole injection layer, a hole transport layer, the light-emitting layer 13, and a hole block layer, an electron transport layer, an electron injection layer and the cathode 12. Among them, the anode 11 may be a metal or an alloy material, such as any one of copper, gold, silver, iron, chromium, nickel, manganese, palladium, platinum, or an alloy formed by more of them; or the anode 11 may be a metal oxide, such as indium oxide, zinc oxide, indium tin oxide, or indium zinc oxide; or the anode may be a conductive polymer, such as polyaniline, polypyrrole, or poly (3-methylthiophene). The cathode 12 may be a metal or an alloy material, such as anyone of the metal material like aluminum, magnesium, silver, indium, tin and titanium, or an alloy formed by combing some of them; or the cathode 12 may be a multilayer material, such as a bilayer material composed of LiF and Al, a bilayer material composed of $LiO_2$ and Al, and a bilayer material composed of $BaF_2$ and Al.

Figure 10:
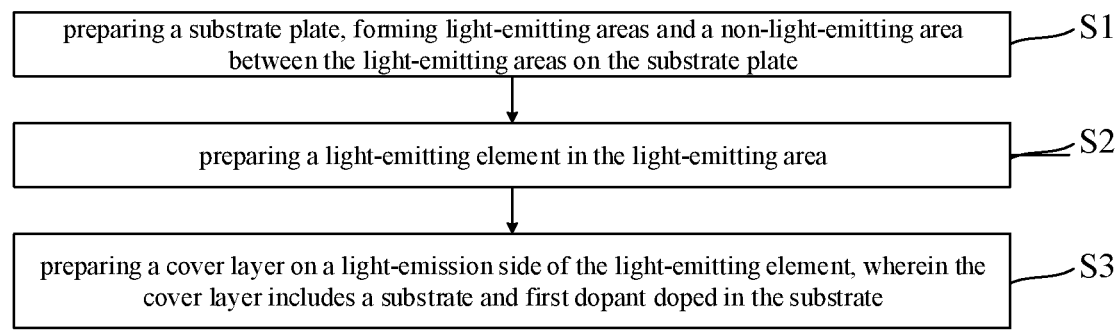
FIG. 10 illustrates a flowchart of a preparation method of a display panel according to an embodiment of the present disclosure.

FIG. 10 illustrates a flowchart of a preparation method of a display panel according to an embodiment of the present disclosure. An embodiment of the present disclosure further provides a preparation method of a display panel, including:

S1: preparing a substrate plate, forming light-emitting areas 10 and a non-light-emitting area 20 around the light-emitting areas 10 on the substrate plate;

The substrate plate may refer to a film layer on a side of an anode 11 facing away from a cathode 12.

S2: preparing a light-emitting element 1 in the light-emitting area 10, the light-emitting element 1 including the anode 11 and the cathode 12 that are arranged opposite to each other, and a light-emitting layer 13 located between the anode 11 and the cathode 12;

S3: preparing a cover layer 2 on a light-emission side of the light-emitting element 1, wherein the cover layer 2 includes a substrate 21 and first dopant 22 doped in the substrate 21, the first dopant 22 is magnetic, and when an external magnetic field intensity applied to the cover layer 2 changes by an amount larger than a preset magnetic field intensity, the first dopant 22 in the substrate 21 is rearranged from a first mode to a second mode.

The specific structure and working principle of the display panel are the same as those of the above embodiments and are not repeated here.

In the preparation method of a display panel according to the present disclosure, by providing the magnetic first dopant in the cover layer on the light-emission side of the light-emitting element, in one aspect, can improve the scattering effect of the emitted light in the cover layer, thereby improving the microcavity effect at a large viewing angles, that is, improving the visual color shift at a large viewing angles; in another aspect, characteristics of magnetic particles being orientated under the action of the magnetic field can be used to achieve the orientated arrangement of the first dopants, to form a more orderly particle arrangement in the cover layer, thereby improving the light extraction effect of the cover layer, that is, improving the luminous efficiency of the light-emitting element.

Figure 11:
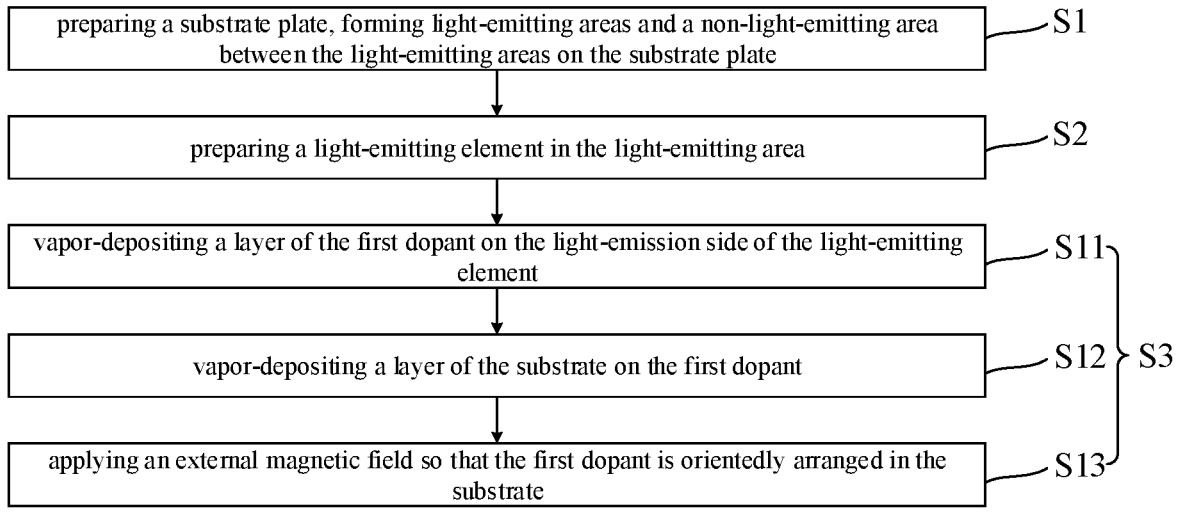
FIG. 11 illustrates a flowchart of another preparation method of a display panel according to an embodiment of the present disclosure.

In one embodiment, as shown in FIG. 11, which illustrates a flowchart of another preparation method of a display panel according to an embodiment of the present disclosure. The above step S3 further includes:

S11: vapor-depositing a layer of the first dopants 22 on the light-emission side of the light-emitting element 1;

S12: vapor-depositing a layer of the substrate 21 on the first dopant 22;

S13: applying an external magnetic field so that the first dopant 22 is rearranged in the substrate 21.

For example, after the preparation of the light-emitting element 1 is completed, in the step S11, a layer of porous island-shaped magnetic nanoparticles (the first dopants 22) is vapor-deposited on the substrate plate on which the cathode 12 is formed, then in the step S12, vapor-deposition of the substrate 21 is performed and low temperature annealing is performed at 100 degrees Celsius, and in the step S13, an arrangement mode of the first dopant 22 is changed from a first mode to a second mode under an action of the external magnetic field, so as to achieve the orientated arrangement of the first dopant 22.

Figure 12:
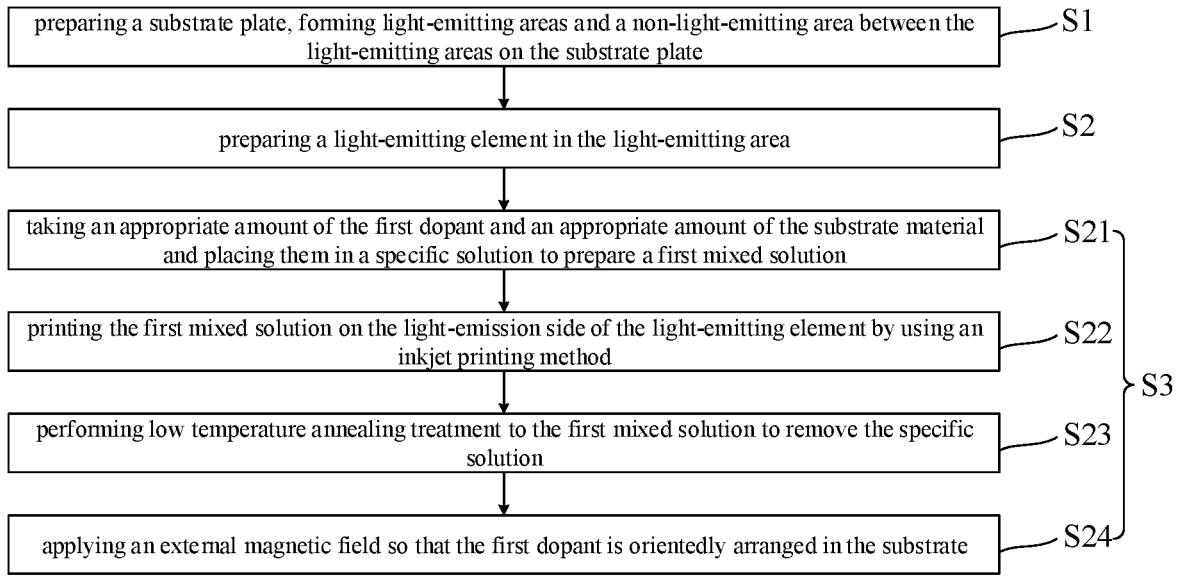
FIG. 12 illustrates a flowchart of another preparation method of a display panel according to an embodiment of the present disclosure.

In one embodiment, FIG. 12 is a flowchart of another preparation method of a display panel according to an embodiment of the present disclosure. The above step S3: further includes:

S21: taking an appropriate amount of the first dopant 22 and an appropriate amount of the substrate 21 material and placing them in a specific solution to prepare a first mixed solution;

S22: printing the first mixed solution on the light-emission side of the light-emitting element 1 by using an inkjet printing method;

S23: performing low temperature annealing treatment to the first mixed solution to remove the specific solution;

S24: applying an external magnetic field so that the first dopants 22 is rearranged in the substrate 21.

Figure 13:
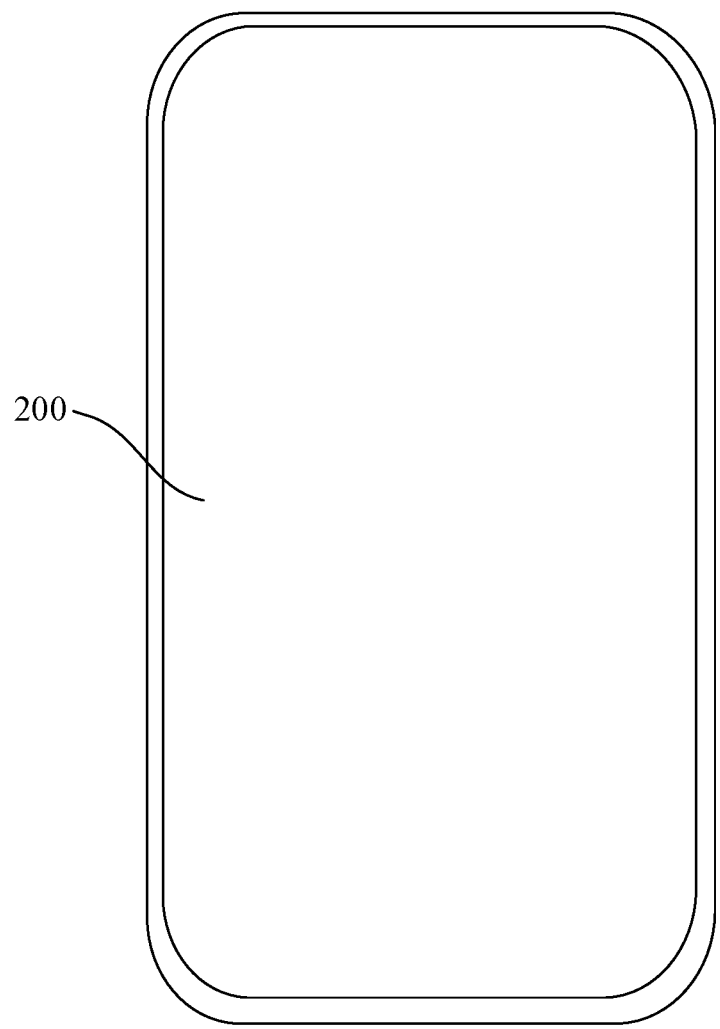
FIG. 13 illustrates a structural schematic diagram of a display device according to an embodiment of the present disclosure.

FIG. 13 illustrates a structural schematic diagram of a display device according to an embodiment of the present disclosure. An embodiment of the present disclosure further provides a display device including the display panel 200 described above.

The specific structure and principle of the display panel 200 may be the same as those of the above embodiment, and details are not described herein again. The display device in the embodiment of the present disclosure may be any electronic device having a display function, such as a touch display screen, a mobile phone, a tablet computer, a laptop computer, an electronic paper book, or a television.

In the display device according to the present disclosure, by providing the first magnetic dopant in the cover layer on the light-emission side of the light-emitting element, in one aspect, can improve the scattering effect of the emitted light in the cover layer, thereby improving the microcavity effect at a large viewing angles, that is, improving the visual color shift at a large viewing angles; in another aspect, characteristics of magnetic particles being orientated under the action of the magnetic field can be used to achieve the orientated arrangement of the first dopants, to form a more orderly particle arrangement in the cover layer, thereby improving the light extraction effect of the cover layer, that is, improving the luminous efficiency of the light-emitting element.

The above are only the preferred embodiments of the present disclosure and are not intended to limit the present disclosure. Any modifications, equivalents, improvements, etc., which are made within the spirit and principles of the present disclosure, should be included in the scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
a plurality of light-emitting areas and a plurality of non-light-emitting areas, wherein the plurality of light-emitting areas are spaced apart from each other by the plurality of non-light-emitting areas,
a plurality of light-emitting elements each located in one of the plurality of light-emitting areas, wherein each of the plurality of light-emitting elements comprises an anode and a cathode arranged opposite the anode, and a light-emitting layer located between the anode and the cathode; and
a cover layer covering a light-emission side of each of the plurality of light-emitting elements,
wherein projections of the anode, the cathode, and the light-emitting layer of one light-emitting element of the plurality of light-emitting elements on the cover layer overlap with each other, and overlapping parts of the projections are all located in one of the plurality of light-emitting areas,
wherein the cover layer comprises a substrate and first dopants doped in the substrate, the first dopants are magnetic,
wherein the cover layer comprises a first section and a second section, wherein the first section is associated with the plurality of light-emitting areas and the second section is associated with the plurality of non-light-emitting areas in a direction perpendicular to a surface of the display panel, and
wherein in the first section, a doping concentration of the first dopants is a first concentration C1, and in the second section, a doping concentration of the first dopants is a second concentration C2, wherein $C2 \geq C1 > 0$, or wherein $C2 > 0$ and $C1 = 0$.

2. The display panel according to claim 1, when an external magnetic field intensity applied to the cover layer is changed by an amount greater than a preset magnetic field intensity, the first dopants in the substrate are rearranged from a first mode to a second mode.

3. The display panel according to claim 2, wherein, when the external magnetic field applied to the cover layer is changed by an amount greater than the preset magnetic field intensity, the first dopants move along a direction in the substrate.

4. The display panel according to claim 3, wherein, the light-emission side faces the cathode, and a first magnetic force is generated on the first dopants by the external magnetic field in a direction from the cathode towards the anode.

5. The display panel according to claim 1, further comprising:
a capping layer covering the light-emission side of each of the plurality of light-emitting elements, and an encapsulation layer located on a side of the capping layer facing away from the light-emitting layer.

6. The display panel according to claim 5, wherein the cover layer is the encapsulation layer.

7. The display panel according to claim 6, wherein the encapsulation layer is a thin film encapsulation layer, comprising a first inorganic layer, a second inorganic layer, and an organic layer located between the first inorganic layer and the second inorganic layer, and the first inorganic layer is located on a side of the second inorganic layer facing towards the light-emitting element.

8. The display panel according to claim 7, wherein, the first dopants are doped in at least one of the first inorganic layer, the second inorganic layer, and the organic layer.

9. The display panel according to claim 8, wherein, the first dopants are doped in the second inorganic layer.

10. The display panel according to claim 5, wherein the cover layer is the capping layer.

11. The display panel according to claim 10, wherein the capping layer comprises a first capping layer and a second capping layer, wherein the second capping layer is located on a side of the first capping layer facing away from the light-emitting element; wherein a doping concentration of the first dopants in the first capping layer is a third concentration C3, and a doping concentration of the first dopants in the second capping layer is a fourth concentration C4, where $C3 \geq C4 \geq 0$.

12. The display panel according to claim 1, wherein, a material of the first dopants is a ferromagnetic material or an antiferromagnetic material.

13. The display panel according to claim 12, wherein, the material of the first dopants is one or more of iron nanoparticles, cobalt nanoparticles, nickel nanoparticles, ferro ferric oxide nanoparticles, and cobalt oxide nanoparticles.

14. The display panel according to claim 1, wherein a material of the first dopants is a paramagnetic material.

15. The display panel according to claim 14, wherein the material of the first dopants is ferro ferric oxide nanoparticles or silica-coated ferro ferric oxide nanoparticles.

16. A display device, comprising the display panel according to claim 1.

17. A preparation method of a display panel, comprising:
preparing a substrate plate, comprising a plurality of light-emitting areas and a plurality of non-light-emitting areas, wherein the plurality of light-emitting areas are spaced apart from each other by the plurality of non-light-emitting areas;
preparing a light-emitting element in each of the plurality of light-emitting areas, wherein the light-emitting element comprises an anode and a cathode that are arranged opposite to each other, and a light-emitting layer located between the anode and the cathode; and
preparing a cover layer on a light-emission side of the light-emitting element, wherein the cover layer comprises a substrate doped with first dopants, wherein the first dopants are magnetic; and wherein when an external magnetic field intensity applied to the cover layer is changed by an amount greater than a preset magnetic field intensity, the first dopants in the substrate are rearranged from a first mode to a second mode;
wherein projections of the anode, the cathode, and the light-emitting layer of one light-emitting element of the plurality of light-emitting elements on the cover layer overlap with each other, and overlapping parts of the projections are all located in one of the plurality of light-emitting areas,
wherein the cover layer comprises a first section and a second section, wherein the first section is associated with the plurality of light-emitting areas and the second section is associated with the plurality of non-light-emitting areas in a direction perpendicular to a surface of the display panel, and
wherein in the first section, a doping concentration of the first dopants is a first concentration C1, and in the second section, a doping concentration of the first dopants is a second concentration C2, wherein $C2 \geq C1 > 0$, or wherein $C2 > 0$ and $C1 = 0$.

18. The preparation method according to claim 17, wherein,
said preparing the cover layer on the light-emission side of the light-emitting element comprises:
vapor-depositing a layer of the first dopants on the light-emission side of the light-emitting element;
vapor-depositing a layer of the substrate on the first dopants; and
applying an external magnetic field to orient the first dopants in the substrate.

19. The preparation method according to claim 17, wherein,
said preparing the cover layer on the light-emission side of the light-emitting element comprises:
placing a first amount of the first dopants and a second amount of a substrate material in a specific solution to prepare a first mixed solution;
printing the first mixed solution on the light-emission side of the light-emitting element by means of inkjet printing;
performing a low temperature annealing treatment on the first mixed solution to remove the specific solution; and
applying an external magnetic field to orient the first dopants in the substrate.

* * * * *